United States Patent [19]

Kuroi et al.

[11] Patent Number: 5,341,022
[45] Date of Patent: Aug. 23, 1994

[54] BIPOLAR TRANSISTOR HAVING A HIGH ION CONCENTRATION BURIED FLOATING COLLECTOR AND METHOD OF FABRICATING THE SAME

[75] Inventors: Takashi Kuroi; Shigeru Kusunoki, both of Itami, Japan

[73] Assignee: Mitsubishi Denki Kabushiki Kaisha, Tokyo, Japan

[21] Appl. No.: 31,988

[22] Filed: Mar. 16, 1993

[30] Foreign Application Priority Data

May 15, 1992 [JP] Japan .................... 4-123177

[51] Int. Cl.⁵ .................... H01L 29/08; H01L 29/32
[52] U.S. Cl. .................... 257/590; 257/593; 257/607; 257/655; 257/928
[58] Field of Search ............... 257/370, 371, 378, 518, 257/592, 272, 590, 617, 928

[56] References Cited
U.S. PATENT DOCUMENTS

| | | | |
|---|---|---|---|
| 4,716,451 | 12/1987 | Hsu et al. | 257/376 |
| 4,796,073 | 1/1989 | Bledsoe | 257/272 |
| 5,151,765 | 9/1992 | Yamauchi | 257/592 |

OTHER PUBLICATIONS

IEEE Transactions on Electron Devices, vol. 35, No. 10, Oct. 1988, pp. 1616–1619, H. J. Bohm, et al., "Megaelectronvolt Phosphorus Implantation for Bipolar Devices".

*Primary Examiner*—Rolf Hille
*Assistant Examiner*—David B. Hardy
*Attorney, Agent, or Firm*—Oblon, Spivak, McClelland, Maier & Neustadt

[57] ABSTRACT

A semiconductor device having a reduced leakage current is fabricated in a short time at a low cost with excellent controllability. A buried layer (20) which includes a principal buried layer (21) of high ion concentration containing secondary defects (22) sandwiched between secondary buried layers (3a, 3b) of low ion concentration from upper and lower directions is formed on a semiconductor substrate (1). The secondary defects (22) have stable gettering effects for reducing defects caused during formation of a transistor (200) and contamination by heavy metals. Further, the secondary buried layers (3a, 3b) prevent depletion layers from reaching the secondary defects (22). The semiconductor device can be formed in a short time since no epitaxial growth is employed.

5 Claims, 11 Drawing Sheets

BIPOLAR TRANSISTOR HAVING A HIGH ION CONCENTRATION BURIED FLOATING COLLECTOR AND METHOD OF FABRICATING THE SAME

BACKGROUND OF THE INVENTION

1. Field of the Invention

The present invention relates to a semiconductor device including a bipolar transistor, and more particularly, it relates to a semiconductor device including a high concentration buried layer formed by high energy ion implantation, and a method of fabricating the same.

2. Description of the Background Art

In general, an integrated circuit including a bipolar transistor is provided with a buried impurity layer Up serving as a floating collector.

Figure 13:
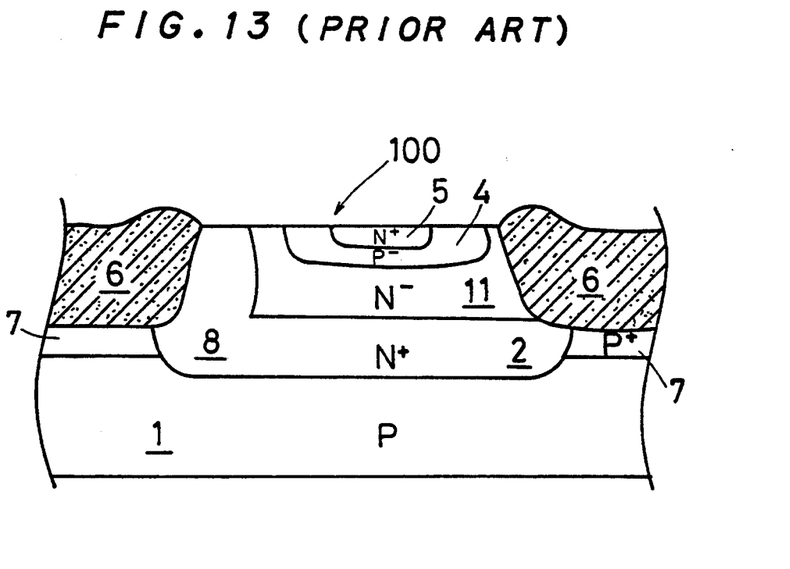
FIG. 13 is a sectional view illustrating the prior art.

FIG. 13 is a sectional view showing a conventional semiconductor device including a bipolar transistor. An epitaxial layer 11 of several $\mu m$ thickness is provided on a buried impurity layer 2, and a bipolar transistor 100 which is isolated by an element isolation film 6 and an isolation region 7 is formed on the epitaxial layer 11. The epitaxial layer 11 serves as a collector region of the bipolar transistor 100, which is formed by an emitter region 5 and a base region 4.

Due to employment of the epitaxial layer 11, however, the conventional semiconductor device requires long-time epitaxial treatment in fabrication steps thereof, and an apparatus required for such epitaxial treatment leads to increase in cost.

Further, the element isolation film 6 which is formed by thermally oxidizing the epitaxial layer 11 is inevitably increased in thickness.

On the other hand, the buried impurity layer 2 is formed before formation of the epitaxial layer 1 1, and hence an automatic doping effect is caused by an impurity contained in the buried impurity layer 2 through heat treatment for epitaxial growth and an oxidizing step for forming the element isolation film 6. Further, the buried impurity layer 2 expands during formation of the epitaxial layer 11 to erode the same, while the degree of such erosion is varied with the area of the buried impurity layer 2 in a loading effect. Such automatic doping and loading effects make it difficult to control formation of the buried impurity layer 2, leading to difficulty in characteristic control of the transistor 100 provided thereon.

In a general bipolar transistor, further, a leakage current results from internal defects thereof or contamination by heavy metals.

SUMMARY OF THE INVENTION

A semiconductor device according to the present invention comprises (a) a first conductivity type semiconductor substrate, (b) a buried layer which is substantially formed by (b-1) a second conductivity type principal buried layer of relatively high concentration, containing defects, formed in the interior of the semiconductor substrate, and (b-2) second conductivity type secondary buried layers of relatively low concentration holding the principal buried layer along the direction of depth of the semiconductor substrate, and (c) a bipolar transistor having a second conductivity type first semiconductor layer of relatively low concentration selectively formed in the surface of the semiconductor substrate on the buried layer, a first conductivity type second semiconductor layer selectively formed on the surface of the first semiconductor layer, and a second conductivity type third semiconductor layer selectively formed on the surface of the second semiconductor layer.

A method of fabricating a semiconductor device according to the present invention comprises steps of (a) selectively forming a plurality of first insulating films on a first conductivity type semiconductor substrate, (b-1) forming a second conductivity type principal buried layer of relatively high concentration containing defects in the interior of the semiconductor substrate, (b-2) forming secondary buried layers of relatively low concentration for holding the principal buried layer along the direction of depth of the semiconductor substrate, and (c) forming a bipolar transistor having a second conductivity type first semiconductor layer of relatively low concentration formed on the buried layer, a first conductivity type second semiconductor layer selectively formed on the surface of the first semiconductor layer, and a second conductivity type third semiconductor layer selectively formed on the surface of the second semiconductor layer.

Preferably, the step (1) includes a step of (b-1-1) implanting ions for causing defects with such energy that the range reaches the interior of the principal buried layer.

According to the present invention, the defects contained in the principal layer are adapted to getter defects and metal impurities introduced during steps of fabricating the semiconductor device. Further, the secondary buried layers prevent the defects contained in the principal buried layer from extension toward activated regions in the semiconductor device, while preventing depletion layers from extension toward the defects contained in the principal buried layer.

As hereinabove described, the inventive semiconductor device comprises a buried layer which is substantially formed by a principal buried layer of relatively high concentration containing defects and secondary buried layers of relatively low concentration holding the principal buried layer along the direction of depth of the semiconductor substrate, whereby internal defects and heavy metals are gettered by the buried layer, and a leakage current is reduced.

In the inventive method of fabricating a semiconductor device, a first semiconductor layer is formed with no epitaxial growth, whereby the semiconductor device can be fabricated in a short time at a low cost with excellent controllability. Further, the yield of the semiconductor device can be improved by a gettering effect provided by the buried layer.

Accordingly, an object of the present invention is to obtain a semiconductor device in a short time at a low cost. Another object of the present invention is to obtain a semiconductor device whose characteristics can be easily controlled by formation of a buried layer with excellent controllability. Still another object of the present invention is to reduce a leakage current.

A further object of the present invention is to provide a fabrication method which is suitable for the aforementioned semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
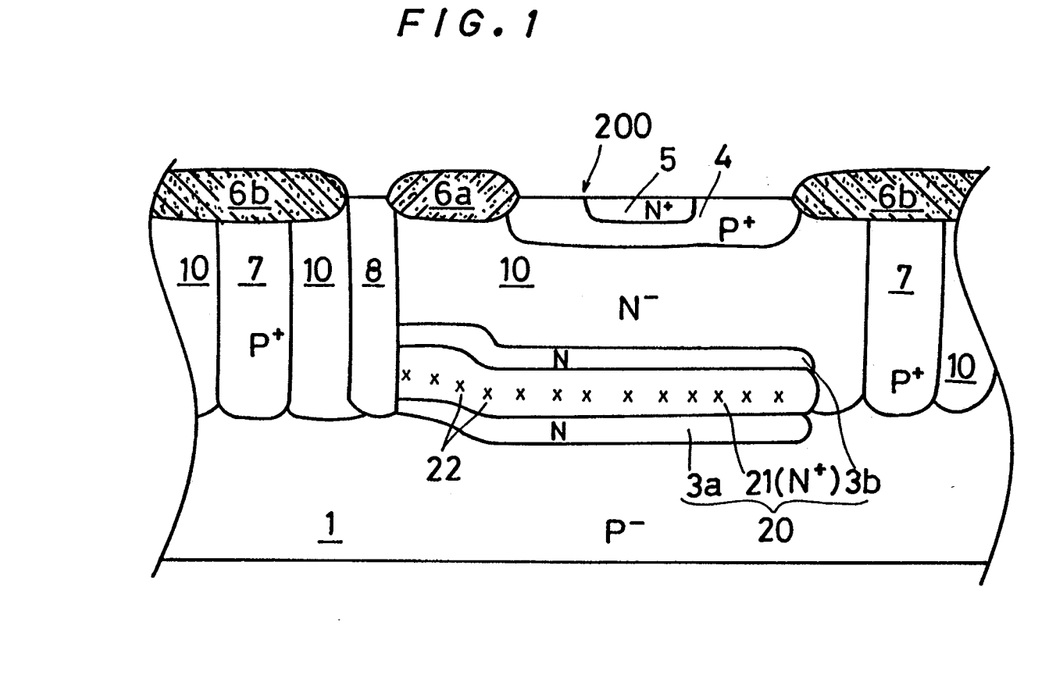
FIG. 1 is a sectional view showing a semiconductor device according to a preferred embodiment of the present invention.

A preferred embodiment of the present invention is now described with reference to the drawings. FIG. 1 is a sectional view showing a semiconductor device according to the present invention. A buried impurity layer 20 for serving as a floating collector is formed on a P$^-$-type semiconductor substrate 1. This buried impurity layer 20 is formed by an N$^+$-type principal buried layer 21 containing secondary defects such as dislocation in its interior, and N-type secondary buried layers 3a and 3b positioned on upper and lower parts of the principal buried layer 21 respectively.

An N$^-$-type collector region 10 is formed on the buried layer 20, and a P$^-$-type base region 4 is selectively formed on the upper surface of the collector region 10. An N$^+$-type emitter region 5 is selectively formed on the upper surface of the base region 4, to form a transistor structure with the collector region 10 and the base region 4.

The buried layer 20 and the collector region 10 are connected with a collector wall 8, which is isolated from the base region 4 by an element isolation oxide film 6a on the surface of the semiconductor device.

A transistor 200 thus formed is isolated by another element isolation oxide film 6b and a P$^-$-type isolation region 7 provided under the same.

The principal buried layer 21 contains secondary defects 22 such as dislocation in its interior, to getter heavy metals and fine defects which are introduced in steps of fabricating the semiconductor device as described later. Thus, the respective regions forming the transistor 200 on the buried layer 20 are protected against contamination by such heavy metals and fine defects.

The secondary defects 22, which are formed through fabrication steps as described below, are extremely stable and recover no monocrystals by later heat treatment.

If depletion layers developed in the collector region 10 or the like reach the secondary defects 22, however, this inevitably results in a leakage current.

Figure 10:
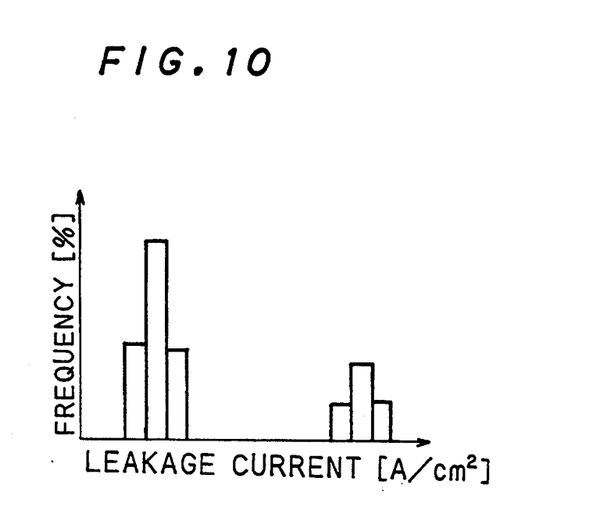

FIG. 10 is a graph showing frequency levels of leakage currents generated in a transistor 200 having no secondary buried layers 3a and 3b. It is understood from this graph that large leakage currents are also frequently generated in this case. In order to prevent this, the principal buried layer 21 is held by the secondary buried layers 3a and 3b of lower impurity concentration from upper and lower directions. Thus, depletion layers are prevented by the secondary buried layers 3a and 3b from reaching the secondary defects 22.

Figure 11:
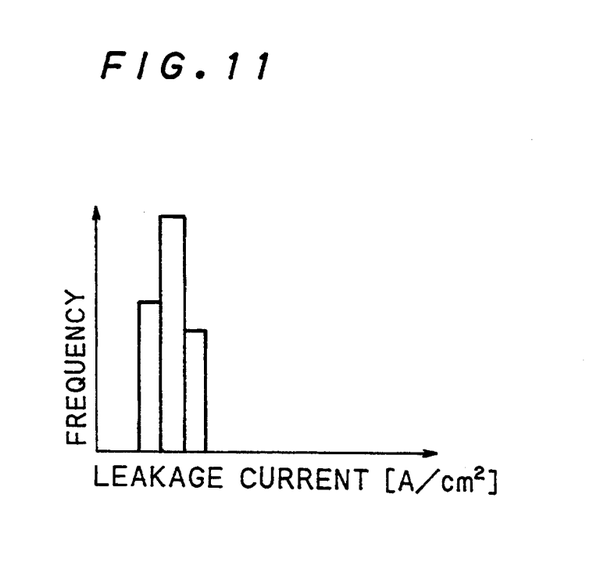
Figure 12:
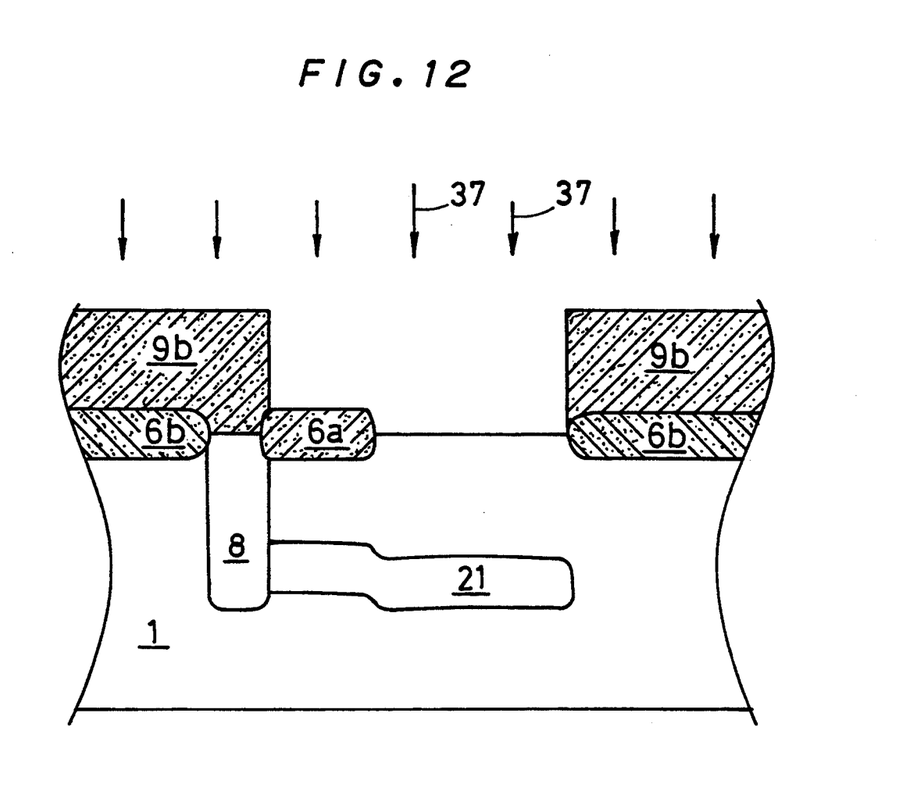
FIG. 12 is a sectional view showing a method of fabricating the semiconductor device according to the preferred embodiment of the present invention.

FIG. 11 is a graph showing frequency levels of leakage currents generated in the transistor 200 having the secondary buried layers 3a and 3b. It is understood from this graph that substantially no large leakage currents appear in this transistor 200.

A method of fabricating the semiconductor device shown in FIG. 1 is now described with reference to FIGS. 2 to 7.

Figure 2:
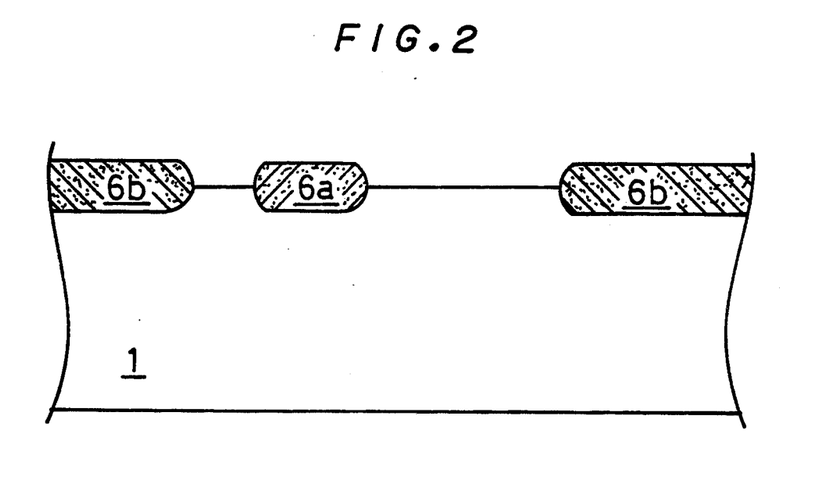
FIGS. 2 to 7 are sectional views showing a method of fabricating the semiconductor device according to the preferred embodiment of the present invention along steps.

First, element isolation films 6a and 6b are formed on the surface of a P$^-$-type semiconductor substrate 1 by selective oxidation, as shown in FIG. 2.

Figure 3:
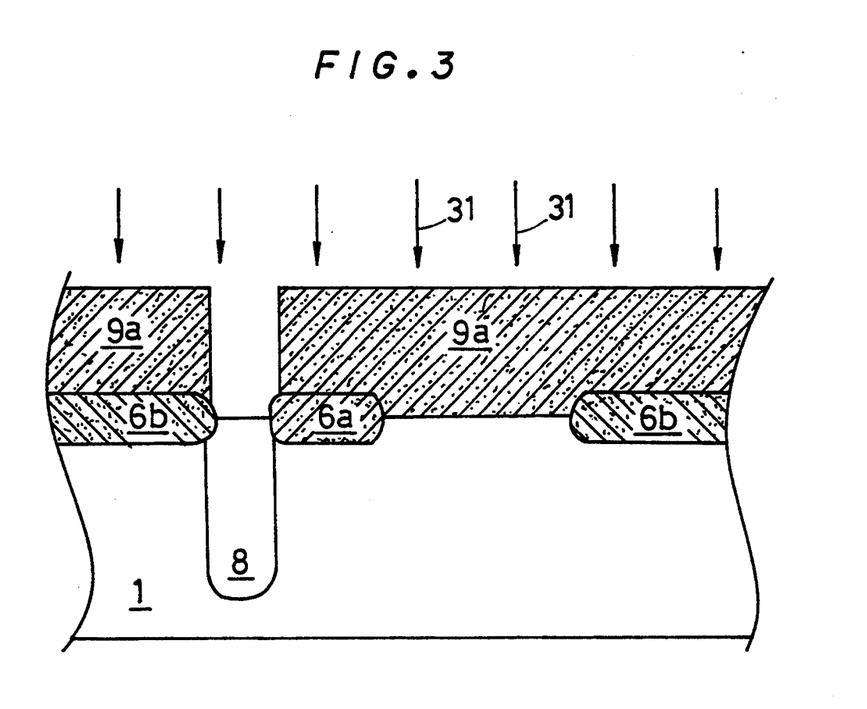

Then, a resist film 9a is selectively formed on the semiconductor substrate 1 and the element isolation films 6a and 6b. This resist film 9a exposes one region of the semiconductor substrate 1 being held between the element isolation films 6a and 6b. The resist film 9a is used as a mask to implant phosphorus ions 31. At this time, the phosphorus ions 31 are implanted a plurality of times at different energy levels, in high energy multistage implantation. Thus, a collector wall 8 is formed by implantation of the phosphorus ions 31 (FIG. 3).

Figure 4:
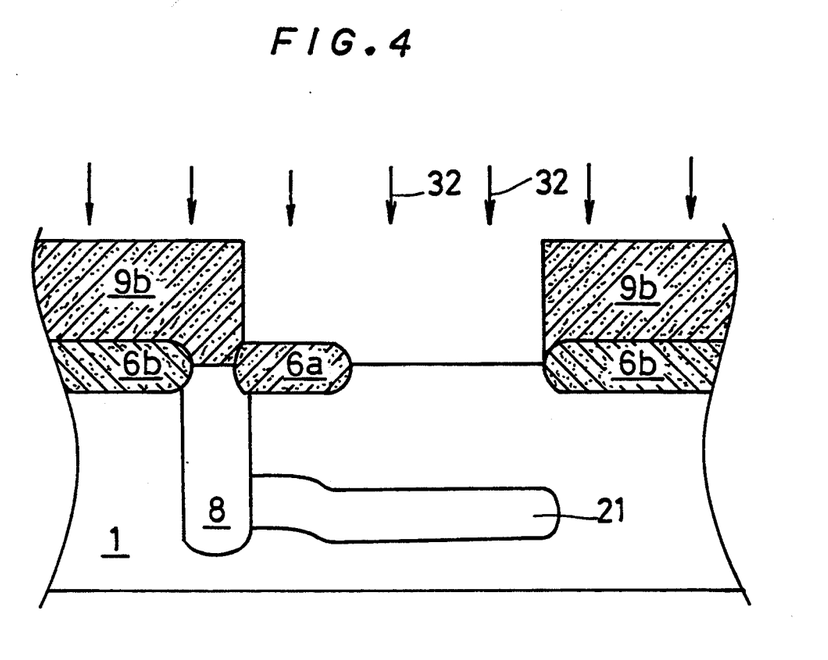

Then the resist film 9a is removed, and another resist film 9b is selectively formed. This resist film 9b exposes a portion, which has been covered with the resist film 9a, of the semiconductor substrate 1 being held between the element isolation films 6a and 6b, and the element isolation film 6a. The resist film 9b is used as a mask to implant phosphorus ions 32 with high energy at an implantation rate of at least $3 \times 10^{14}$ cm$^{-2}$, to form a principal buried layer 21 in a position of several μm in depth (FIG. 4).

Figure 5:
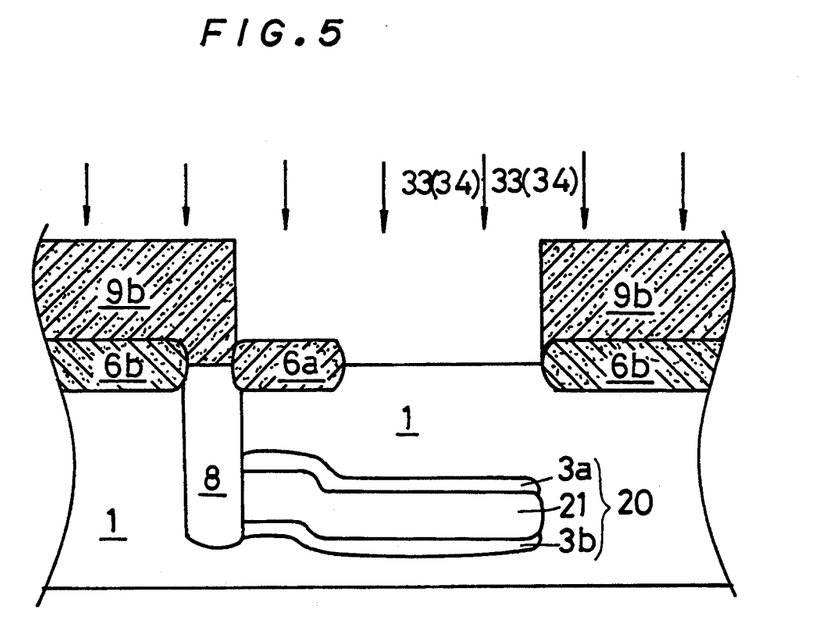

Then the implantation energy is increased from the level employed for forming the principal buried layer 21, to implant phosphorus ions 33 at an implantation rate of not more than $1 \times 10^{13}$ cm$^{-2}$. Thus, a secondary buried layer 3b is formed on the lower part of the principal buried layer 21. Then, the implantation energy is reduced from the level employed for forming the principal buried layer 21, to implant phosphorus ions 34 at an implantation rate of not more than $1 \times 10^{13}$ cm$^{-2}$. Thus, another secondary buried layer 3a is formed on the upper part of the principal buried layer 21 (FIG. 5).

A buried layer 20 is thus formed by the principal buried layer 21 and the secondary buried layers 3a and 3b, in a step after that for forming the element isolation films 6a and 6b. In such formation of the buried layer 20, a part of a semiconductor substrate 1 is already present thereon even if no epitaxial growth is performed. Thus, it is possible to avoid automatic doping and loading effects, which have generally been caused following epitaxial treatment, in the steps of fabricating the semiconductor device.

Figure 6:
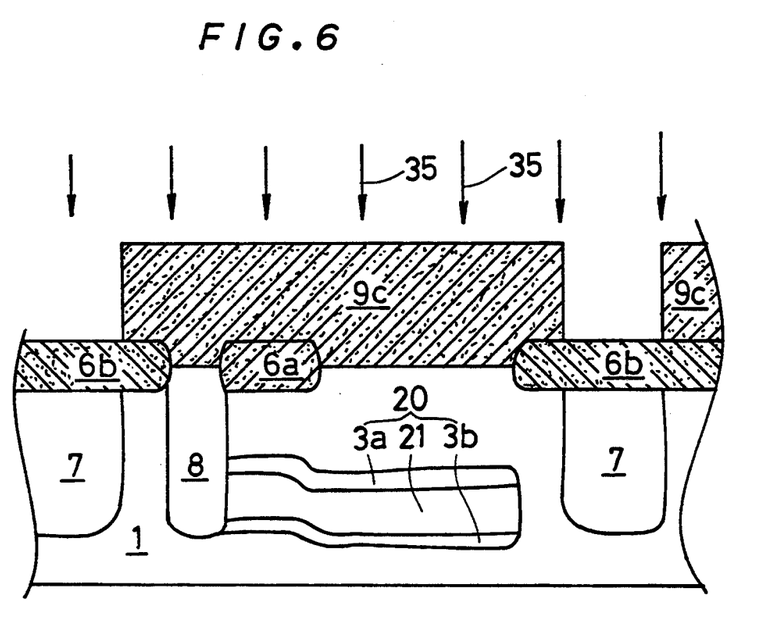

Then the resist film 9b is removed and still another resist film 9c is selectively formed to partially expose the isolation oxide film 6b. The resist film 9c is used as a mask to multistage-implant boron ions 35 with high energy, thereby forming an isolation region 7 under the isolation oxide film 6b (FIG. 6).

Figure 7:
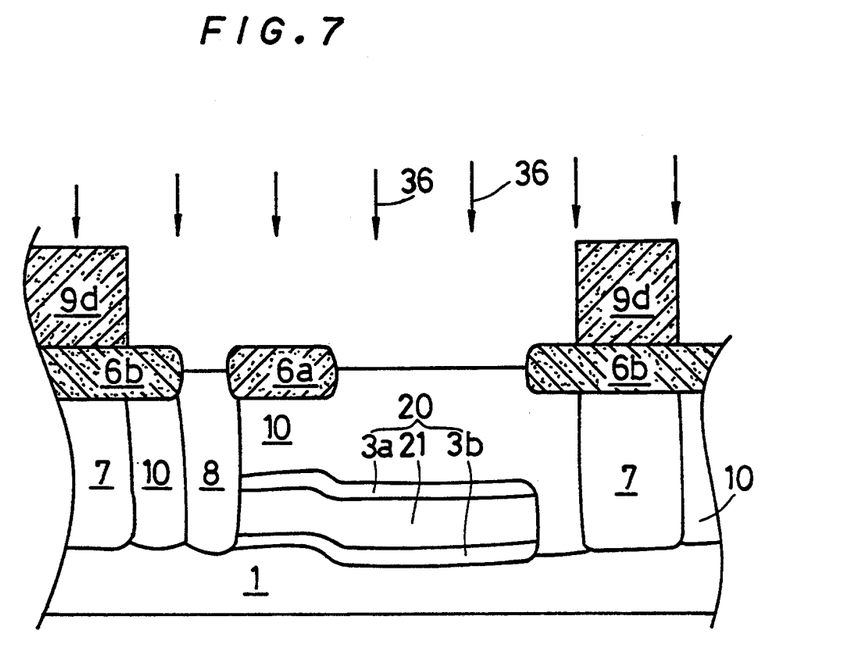

Then the resist film 9c is removed and a further resist film 9d is selectively formed for defining a complementary mask for the resist film 9c, to multistage-implant phosphorus ions 36 thereby forming a collector region 10 (FIG. 7).

Thereafter a base region 4 and an emitter region 5 are formed in the collector region 10. At this time, secondary defects 22 are developed in the principal buried layer 21 by heat treatment. Namely, the secondary buried layers 3a and 3b perform solid-state epitaxial growth for defect recovery by the heat treatment. Thus, the principal buried layer 21 is exposed to such solid-state epitaxial growth from upper and lower directions, to develop the secondary defects 22 such as dislocation in the vicinity of its center. Such secondary defects 22 cause no recovery by further heat treatment, thereby providing stable gettering effects.

Figure 8:
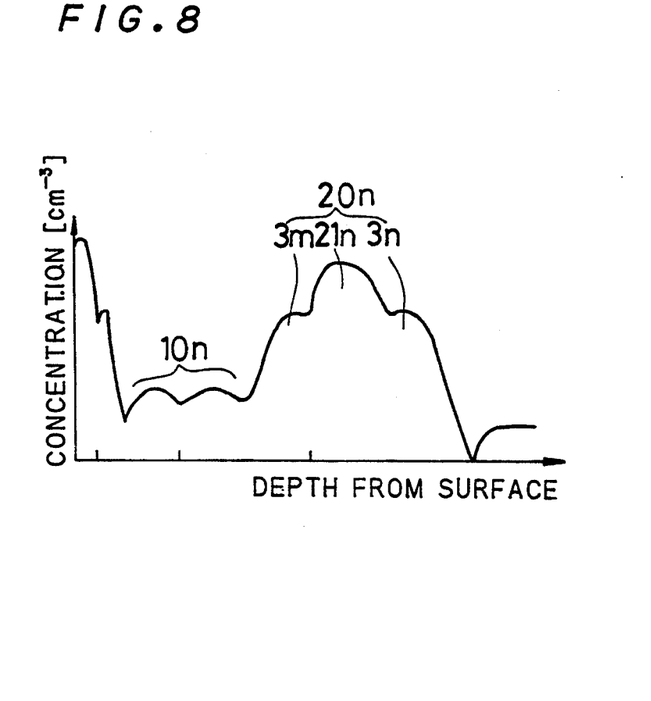
FIG. 8 is a graph showing impurity concentration of the semiconductor device according to the preferred embodiment of the present invention.

FIG. 8 shows impurity concentration levels of the regions located under the emitter region 5 for the purpose of reference. It is understood that impurity concentration $20n$ of the buried layer 20 is higher than impurity concentration $10n$ of the collector region 10, while impurity concentration $21n$ of the principal buried layer 20 is higher than impurity concentration levels $3m$ and $3n$ of the secondary buried layers 3a and 3b in particular.

Figure 9:
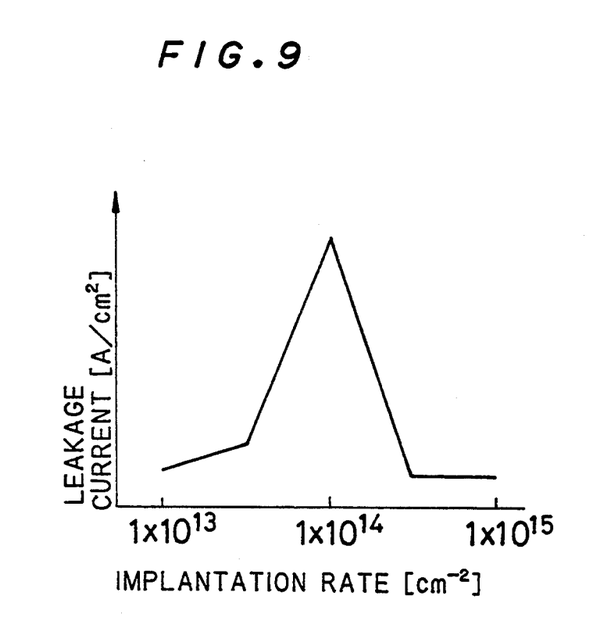
FIGS. 9 to 11 are graphs illustrating a method of fabricating a semiconductor device according to a preferred embodiment of the present invention.

The rate of ion implantation required for forming such principal and secondary buried layers 21, 3a and 3b must be properly controlled. FIG. 9 is a graph showing the relation between the implantation rates and the values of a leakage current generated in the transistor 200. Since the leakage current has the maximal value with respect to the implantation rate of $1 \times 10^{14} cm^{-2}$, the principal buried layer 21 is preferably formed at an implantation rate of at least $3 \times 10^{14} cm^{-2}$, while the secondary buried layers 3a and 3b are preferably formed at an implantation rate of not more than $1 \times 10^{13} cm^{-2}$.

In order to improve the gettering ability of the principal buried layer, $C^+$, $O^+$, $F^+$, $Si^+$ or $Ge^+$ ions for developing defects may be implanted through the mask 9b for forming the principal buried layer 21 so that the range reaches the interior of the principal buried layer 21 by adjusting the energy. It is possible to develop the secondary defects 22 of high concentration by implanting such ions into the principal buried layer 21 in high concentration.

Although phosphorus ions are employed as an N-type impurity in the aforementioned embodiment, $As^+$ or $Sb^+$ ions may be employed in place thereof. On the other hand, the present invention is applicable not only to an NPN transistor, but to a PNP transistor.

Further, the transistor may be isolated not only by P-N isolation described with reference to the embodiment, but by another isolation method such as trench isolation.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate of a first conductivity type;
   a buried layer formed on said semiconductor substrate, said buried layer including a principal buried layer of a second conductivity type sandwiched between two secondary buried layers of said second conductivity type, each of said secondary buried layers having an ion concentration lower than that of said principal buried layer, wherein said principal buried layer contains ion-implanted defects; and
   a bipolar transistor including a first semiconductor layer of said second conductivity type having an ion concentration lower than that of said principal buried layer, said first semiconductor layer being selectivity formed on a surface of said buried layer, a second semiconductor layer of said first conductivity type selectively formed on a surface of said first semiconductor layer, and a third semiconductor layer of said second conductivity type selectively formed on a surface of said second semiconductor layer, a surface of said second semiconductor layer being exposed on an outer surface of said semiconductor device.

2. A semiconductor device according to claim 1, wherein said bipolar transistor further includes a collector wall of said second conductivity type which is connected to both of said first semiconductor layer and said buried layer, a surface of said collector wall being exposed on said outer surface of said semiconductor device.

3. A semiconductor device according to claim 2, further comprising a first insulating film selectively formed on said outer surface of said semiconductor device for isolating said bipolar transistor on said outer surface of said semiconductor device, said first insulating film not being connected to said buried layer.

4. A semiconductor device according to claim 3, further comprising an isolation layer of said first conductivity type formed on a lower surface of said first insulating film.

5. A semiconductor device according to claim 4, further comprising a second insulating film selectively formed on said outer surface of said semiconductor device for isolating said surface of said collector wall that is exposed on said outer surface of said semiconductor device from said surface of said second semiconductor layer that is exposed on said outer surface of said semiconductor device.

* * * * *